United States Patent [19]
Hseuh et al.

[11] Patent Number: 5,932,892
[45] Date of Patent: *Aug. 3, 1999

[54] HIGH-VOLTAGE TRANSISTOR

[75] Inventors: Fu-Lung Hseuh, Cranberry; Alfred Charles Ipri, Princeton, both of N.J.; Gary Mark Dolny, Newtown, Pa.; Roger Green Stewart, Hillsborough Township, N.J.

[73] Assignee: Sarnoff Corporation, Princeton, N.J.

[*] Notice: This patent is subject to a terminal disclaimer.

[21] Appl. No.: 08/993,495

[22] Filed: Dec. 18, 1997

Related U.S. Application Data

[62] Division of application No. 08/710,271, Sep. 16, 1996, Pat. No. 5,736,752, which is a continuation of application No. 08/295,374, Aug. 24, 1994, Pat. No. 5,587,329.

[51] Int. Cl.$^6$ .............................. H01L 29/04; H01L 29/76
[52] U.S. Cl. ............................ 257/59; 257/72; 257/409
[58] Field of Search .............................. 257/59, 72, 296, 257/365, 366, 344, 408, 409

[56] References Cited

U.S. PATENT DOCUMENTS

| | | | |
|---|---|---|---|
| 4,006,383 | 2/1977 | Luo et al. | 315/169 |
| 4,528,480 | 7/1985 | Unagami et al. | 315/169.1 |
| 4,601,097 | 7/1986 | Shimbo | 29/572 |
| 4,737,684 | 4/1988 | Seto et al. | 313/503 |
| 4,766,474 | 8/1988 | Nakagawa et al. | 257/409 |
| 4,876,212 | 10/1989 | Koury | 437/34 |
| 4,908,328 | 3/1990 | Hu et al. | 437/63 |
| 4,926,243 | 5/1990 | Nakagawa et al. | 257/659 |
| 4,983,880 | 1/1991 | Abdalla et al. | 313/506 |
| 5,032,531 | 7/1991 | Tsutsui et al. | 437/40 |
| 5,056,895 | 10/1991 | Kahn | 359/87 |
| 5,057,450 | 10/1991 | Bronner et al. | 437/62 |
| 5,095,248 | 3/1992 | Sato | 315/169 |
| 5,118,987 | 6/1992 | Leksell et al. | 313/505 |
| 5,132,816 | 7/1992 | Itoh et al. | 359/56 |
| 5,189,500 | 2/1993 | Kusunoki | 359/72 |
| 5,198,721 | 3/1993 | Kahng et al. | 313/503 |
| 5,233,459 | 8/1993 | Bozler et al. | 439/230 |
| 5,258,320 | 11/1993 | Zavracky et al. | 437/40 |
| 5,308,779 | 5/1994 | Sarma | 437/40 |
| 5,309,060 | 5/1994 | Sharpless et al. | 313/511 |
| 5,563,427 | 10/1996 | Yudasaka et al. | 257/72 |
| 5,736,752 | 4/1998 | Hseuh et al. | 257/59 |

OTHER PUBLICATIONS

Suzuki et al., "The Fabrication of TFEL Displays Driven by a–Si TFTs", SID 92 Digest, pp. 344–347, 1992.

*Primary Examiner*—Tom Thomas
*Assistant Examiner*—Ori Nadav
*Attorney, Agent, or Firm*—William J. Burke

[57] ABSTRACT

In an active matrix electroluminescent display, a pixel containing a grounded conductive electric field shield between an EL cell and the switching electronics for the EL cell. In a method of fabricating the pixel, first, an EL cell switching circuit is formed, then an insulating layer is formed over the switching circuit and a conductive layer (the field shield) is formed over the insulating layer. A through hole is provided in the field shield such that an electrical connection can be made between the switching circuit and an EL cell. The EL cell is then conventionally formed on top of the shield layer. Consequently, the shield isolates the switching circuit from the EL cell and ensures that any electric fields produced in the EL cell do not interfere with the operation of the switching electronics. Furthermore, the switching circuitry for each cell contains two transistors; a low voltage MOS transistor and a high voltage MOS transistor. The low voltage transistor is controlled by signals on a data and a select line. When activated, the low voltage transistor activates the high voltage transistor by charging the gate of the high voltage transistor. This gate charge is stored between the gate electrode of the high voltage transistor and the electric field shield. Additionally, to improve the breakdown voltage of the high voltage transistor, a capacitive divider network is fabricated proximate the drift region of that transistor. As such, the network uniformly distributes an electric field over the drift region.

6 Claims, 4 Drawing Sheets

HIGH-VOLTAGE TRANSISTOR

This application is a divisional of application Ser. No. 08/710,271, filed on Sep. 16, 1996, now U.S. Pat. No. 5,736,752 which is a continuation of application Ser.No. 08/295,374, filed on Aug. 24, 1994, now U.S. Pat. No. 5,587,329.

The United States Government has rights to this invention pursuant to Contract No. MDA972-92-C-0037.

The invention relates to active matrix electroluminescent displays and, more particularly, to an electroluminescent display pixel having an electric field shield between pixel switching electronics and the electroluminescent cell of the pixel.

BACKGROUND OF THE DISCLOSURE

Thin film active matrix electroluminescent (EL) displays (AMELD) are well known in the art and are used as flat panel displays in a variety of applications. A typical display includes a plurality of picture elements (pixels) arranged in rows and columns. Each pixel contains an EL cell having an EL phosphor active layer between a pair of insulators and a pair of electrodes. Additionally, each pixel contains switching circuitry that controls illumination of the cell.

One example of a prior art AMELD is disclosed in U.S Pat. No. 5,302,966, issued Apr. 12, 1994. The disclosed AMELD includes a switching circuit associated with each pixel for controlling application of a high voltage to the EL cell. Specifically, the switching circuit disclosed in the '966 patent comprises a first transistor having its gate connected to a select line, its source connected to a data line and its drain connected to a gate of a second transistor and through a first capacitor to ground. The drain of the second transistor is connected to ground potential, its source is connected through a second capacitor to ground and to one electrode of an EL cell. The second electrode of the EL cell is connected to a high voltage alternating current source for exciting the phosphor within the EL cell. In addition to this specific circuit arrangement, the '966 patent discloses a number of other arrangements of transistors that can comprise the cell switching circuitry.

In operation, as is well known in the AMELD art, the data and select lines are appropriately energized to cause a particular switching circuit, e.g., transistor pair, to apply high voltage to a particular EL cell. Once the voltage is applied to the cell, current passing through the EL cell causes the phosphor layer therein to become luminescent.

In an AMELD having a high density of EL cells, electric fields generated by the high voltage applied to the EL cells interferes with the operation of the cell switching circuitry. Specifically, the electric fields couple to the transistors as well as the data and select lines that are located proximate to an active EL cell. Consequently, in response to errant coupling of the electric fields, the EL cells may be activated or deactivated in error.

Therefore, a need exists in the art for an electroluminescent pixel that contains a conductive electric field shield between the EL cells and their associated switching circuitry such that the EL cells are isolated from the switching circuitry.

SUMMARY OF THE INVENTION

The present invention overcomes the disadvantages associated with the prior art AMELD pixels by incorporating a conductive electric field shield between each EL cell and the switching electronics for each EL cell. Specifically, in a method of fabricating a pixel with such a shield, EL cell switching circuitry is formed upon a substrate, an insulating layer is then formed over the circuitry, and then a conductive layer (the electric field shield) is formed over the insulating layer. A dielectric layer is formed over the shield. A through hole is provided through the shield and the dielectric layer such that an electrical connection can be made between the switching circuitry and an EL cell. The EL cell is conventionally formed on top of the dielectric layer. One electrode of the EL cell is connected to the switching circuitry via the through hole and another electrode of the EL cell is connected to a high voltage alternating current source. The electric field shield is connected to ground. Consequently, the shield isolates the switching circuitry, especially the storage node, from the EL cell and ensures that any electric fields produced in the EL cell do not interfere with the operation of the switching electronics.

Furthermore, the switching circuitry for each cell contains two transistors; a low voltage MOS transistor and a high voltage MOS transistor. The low voltage transistor is controlled by signals on a data and a select line. When activated, the low voltage transistor activates the high voltage transistor by charging the gate of the high voltage transistor. The gate charge is stored between the gate electrode of the transistor and the electric field shield. Additionally, to improve the breakdown voltage of the high voltage transistor, a capacitive divider network is fabricated proximate the drift region of that transistor. As such, the network uniformly distributes an electric field over the drift region of the high voltage transistor.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
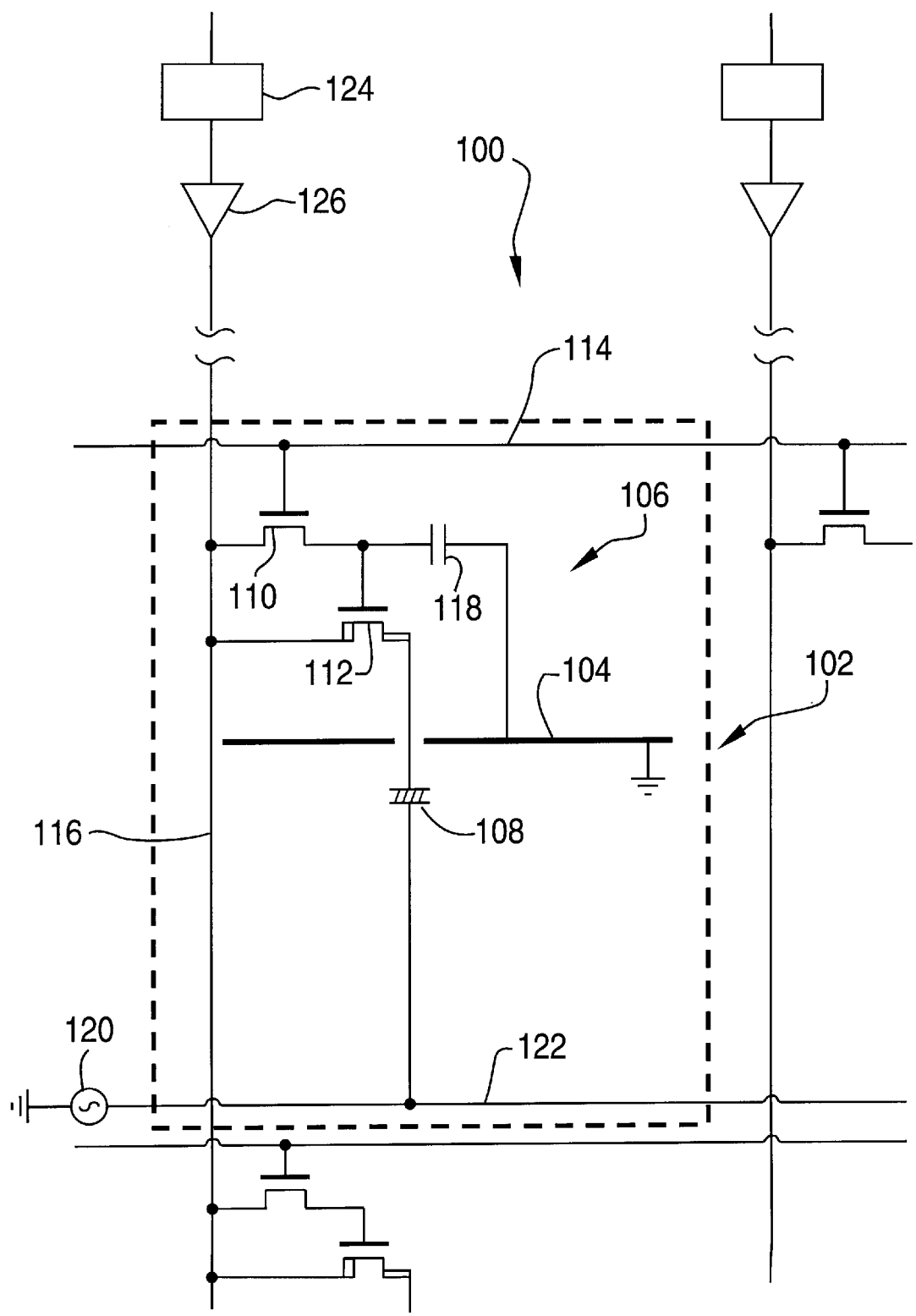
FIG. 1 depicts a schematic diagram of an AMELD pixel including an electric field shield of the present invention.

FIG. 1 depicts a schematic diagram of an active matrix electroluminescent display (AMELD) 100. The AMELD contains an arrangement of rows and columns of AMELD pixels. For simplicity, FIG. 1 depicts one of these AMELD pixels 102. In accordance with a preferred embodiment of the present invention, the pixel 102 contains an electric field shield 104 between a switching circuit 106 and an EL cell 108.

As for the specific structure of the AMELD pixel 102, the switching circuit 106 contains a pair of transistors 110 and 112 that are switchable using a select line 114 and a data line 116. To form circuit 106, transistor 110, typically a low voltage metal oxide semiconductor (MOS) transistor, has its gate connected to the select line 114, its source connected to the data line 116, and its drain connected to the gate of the second transistor 112 and through a first capacitor 118 to the electric field shield 104. The electric field shield is connected to ground. Importantly, as shall be discussed in detail below, the first capacitor is actually manifested as the capacitance between the shield 104 and the gate electrode of transistor 112. To complete the switching circuit, transistor 112, typically a high voltage MOS transistor, has its source connected to the data line 116 and its drain connected to one electrode of the EL cell 108. A high voltage bus 122 connects the second electrode of the EL cell to a high voltage (e.g., 250 volts) alternating current (AC) source 120.

The transistors used to form the switching circuit 106 may be of any one of a number of designs. Typically, the first transistor is a low breakdown voltage (less than 10 volts) MOS transistor. The second transistor is typically a double diffused MOS (DMOS) device having a high breakdown voltage (greater than 150 volts). The transistors can be either n- or p-channel devices or a combination thereof, e.g., two NMOS transistors, two PMOS transistors or a combination of NMOS and PMOS transistors. For a further discussion of the fabrication of switching circuitry for an AMELD, the reader should consult U.S. Pat. No. 5,302,966 which is hereby incorporated by reference.

In an alternative arrangement of the switching circuit, the drain of the second transistor is connected to one electrode of the EL cell via a resistor. The resistor is typically 50 to 100 kΩ and is typically fabricated in the drift region of the second transistor. This resistor limits the drain current through the second transistor and, as such, provides circuit protection from excessive drain current.

In operation, images are displayed on the AMELD as a sequence of frames, in either an interlace or progressive scan mode. During an individual scan, the frame time is subdivided into a separate LOAD period and an ILLUMINATE period. During the LOAD period, an analog-to-digital converter 124 and a low impedance buffer 126 produce data for storage in the switching circuitry. The data is loaded from the data line 116 through transistor 110 and stored in capacitor 118. Specifically, the data lines are sequentially activated one at a time for the entire display. During activation of a particular data line, a select number of select lines are activated (strobed). Any transistor 110, located at the junction of activated data and select lines, is turned ON and, as such, the voltage on the data line charges the gate of transistor 112. This charge is primarily stored in a capacitance between the gate and the electric field shield (represented as capacitor 118). This charge storage is discussed in detail with regard to FIG. 2L. As the charge accumulates on the gate of transistor 112, the transistor begins conduction, i.e., is turned ON. At the completion of the LOAD period, the high voltage transistor in each pixel that is intended to be illuminated is turned ON. As such, during the ILLUMINATE period, the high voltage AC source that is connected to all the pixels in the display through bus 122 is activated and simultaneously applies the AC voltage to all the pixels. However, current flows from the AC source through the EL cell and the transistor 112 to the data line 116 in only those pixels having an activated transistor 112. Consequently, during the ILLUMINATE period of each frame, the active pixels produce electroluminescent light from their associated EL cells.

FIGS. 2A–2L schematically depict a process for fabricating the AMELD pixel depicted in FIG. 1. Ultimately, the illustrative pixel contains two NMOS devices as the switching circuitry. From the following discussion, those skilled in the art will be able to fabricate other combinations of transistors to form the switching circuitry such as two PMOS devices or a combination of PMOS and NMOS devices.

Figure 2A:
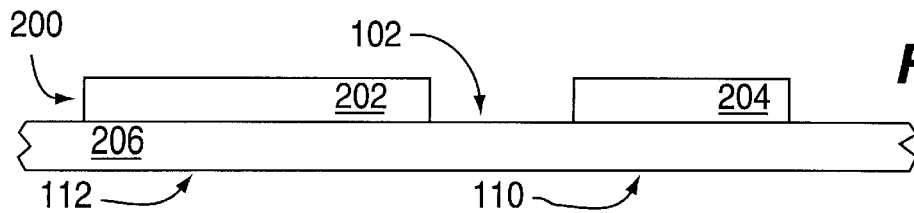
FIGS. 2A–2L is a schematic cross-sectional illustration of the steps in a process for fabricating an AMELD pixel in accordance with the present invention.

As shown in FIG. 2A, the fabrication process begins with etching an N-layer 200 to form discrete islands 202 and 204. The N layer is approximately 0.35 to 1 μm thick and is supported by a 1 μm thick $SiO_2$ substrate 206. The N layer is a layer of phosphorus doped silicon. The discrete islands 202 and 204 designate areas where transistors 112 and 110 are respectively formed.

Figure 2B:
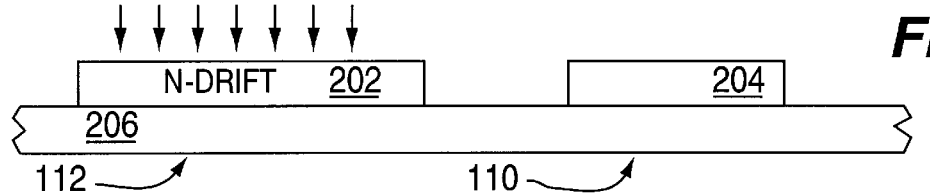
Figure 2C:
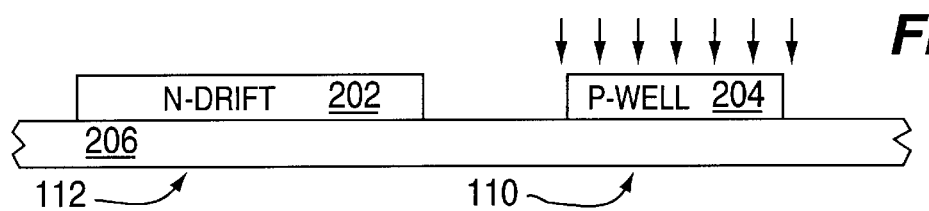

In FIG. 2B, an N drift region for transistor 112 is produced by implanting ions such as phosphorus using 110 keV into island 202. In FIG. 2C, a P-well for transistor 110 is produced by implanting ions such as boron using 80 keV into island 204. These two implantation steps define the active transistor areas.

Figure 2D:
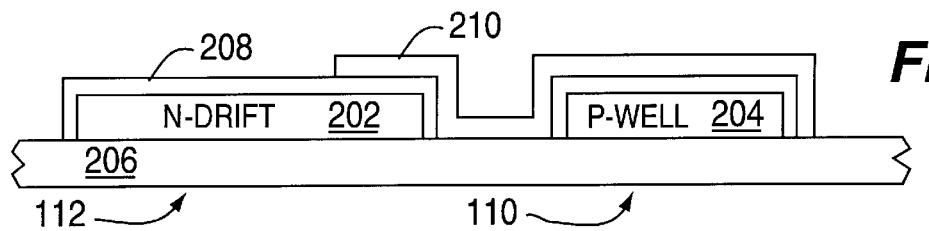
Figure 2E:
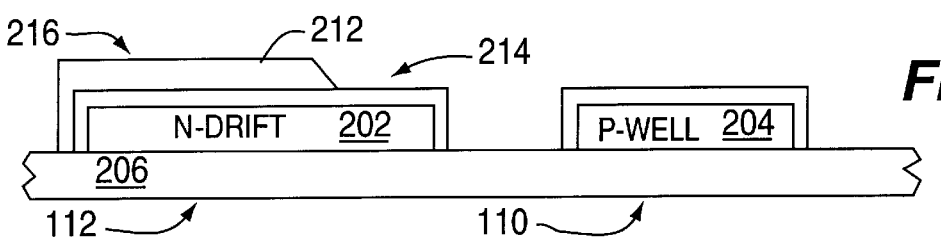

In FIG. 2D, a LOCOS oxidation process is used to form both thick and thin oxide layers over the silicon islands by first growing an oxide layer 208 over the islands. Thereafter, a silicon nitride layer 210 is formed over the oxide layer 208 as a mask that permits a second oxide layer 212 to be grown above the left side of the N drift region. As such, the oxide layer is thin on the right side 214 of the N drift region and thick on the left side 216 of the N drift region. In FIG. 2E, the silicon nitride layer 210 is removed by etching and leaves a step shaped oxide layer over the N drift region.

Figure 2F:
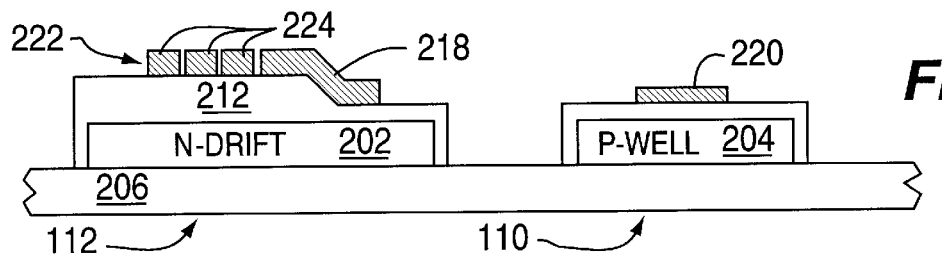
Figure 2G:
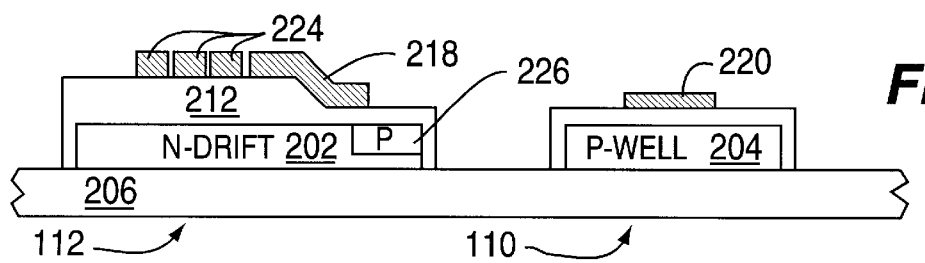
Figure 2H:
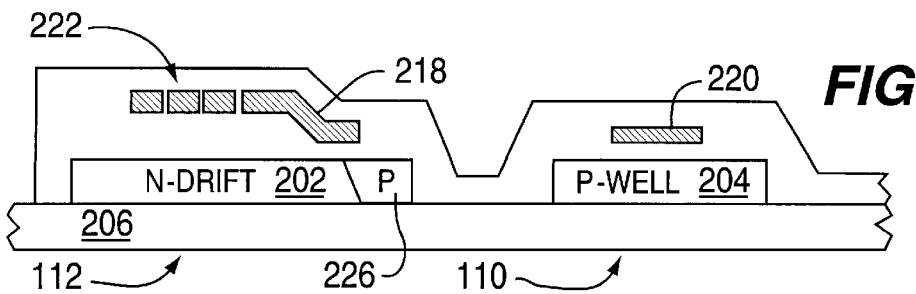

In FIG. 2F, a first polysilicon layer (poly1) is deposited and patterned to form gates 218 and 220 and a select line (not shown) connected to the gate of transistor 110. Additionally, the left side of the poly1layer forms elements 224 of a capacitive divider network 222. The remaining elements of the network 222 are deposited, as described below, when subsequent layers of polysilicon are deposited. As shown in FIG. 2G, a P type region 226 is formed by implanting boron ions using a 40 keV beam. The implanted ions are then driven through the silicon by heating the structure to approximately 1150 degrees C. for about 4 hours. Thereafter, another oxide layer is grown over the entire structure. The resulting structure is shown in FIG. 2H.

Figure 2I:
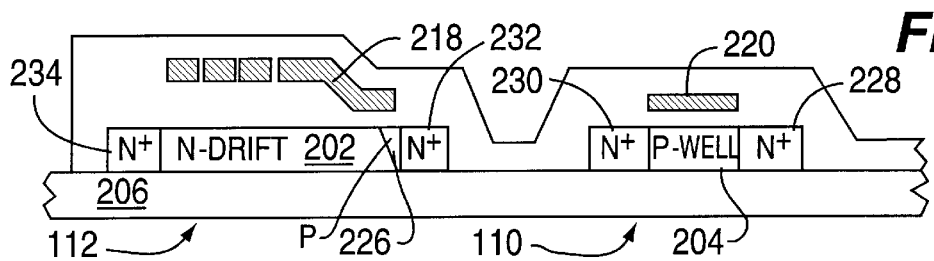

As shown in FIG. 2I, four $N^+$ regions are implanted using an ion beam of arsenic atoms at 110 keV. These regions form the source and drain regions of the transistors. Specifically, regions 228 and 230 respectively form the source and drain of transistor 110, while regions 234 and 232 respectively are the drain and source of transistor 112. Thereafter, an oxide layer is formed over the entire pixel area.

Figure 2J:
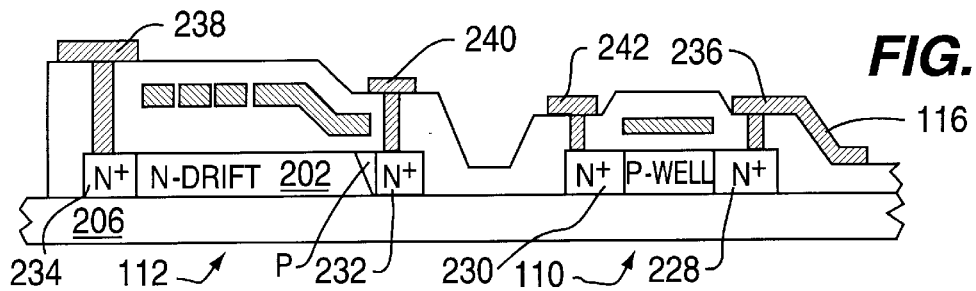

FIG. 2J depicts the resulting structure after etching an opening to access the drain and source regions of transistors 110 and 112, depositing a second polysilicon layer (poly2) and patterning the poly2 layer to form the data line 116 as well as conductive pads 236 and 240 for connecting the data line 116 to the source regions 228 and 232. Additionally, openings are etched such that the patterned poly2 layer forms conductive contact pads 238 and 242 for drain regions 234 and 230. The poly2 layer is also used to connect the gate of transistor 112 to the drain of transistor 110; however, for simplicity, this connection is not shown.

Figure 2K:
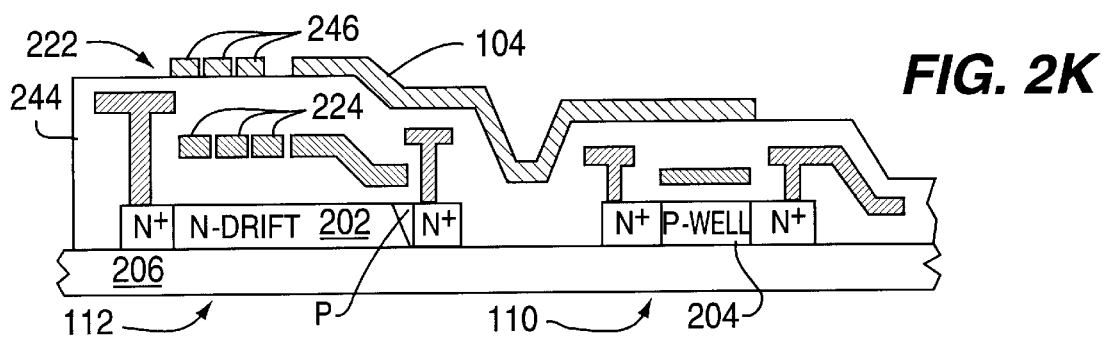

FIG. 2K depicts the resulting structure after an oxide layer 244 is grown to a thickness of approximately 200 NM over the entire pixel area, a third polysilicon layer (poly3) is deposited and patterned to form the electric field shield 104. Also, as this layer is formed, elements 246 of the capacitive divider network 222 are formed. These elements are spaced apart from the underlying elements 224 of the network. However, the edges of elements 246 overlap the edges of elements 224 by approximately 2 μm. Operation of the network is described in detail below with respect to FIG. 4.

As an alternative to using polysilicon as the electric field shield and the elements of the capacitive network, a refractory metal such as tungsten can be used. Generally, the only requirement for the material used to form the electric field shield is that it be a conductor and have a melting point greater than 800 degrees C. To facilitate isolation of the electric field generated by the EL cell, the shield is connected to ground (for simplicity, this connection is not shown).

Figure 2L:
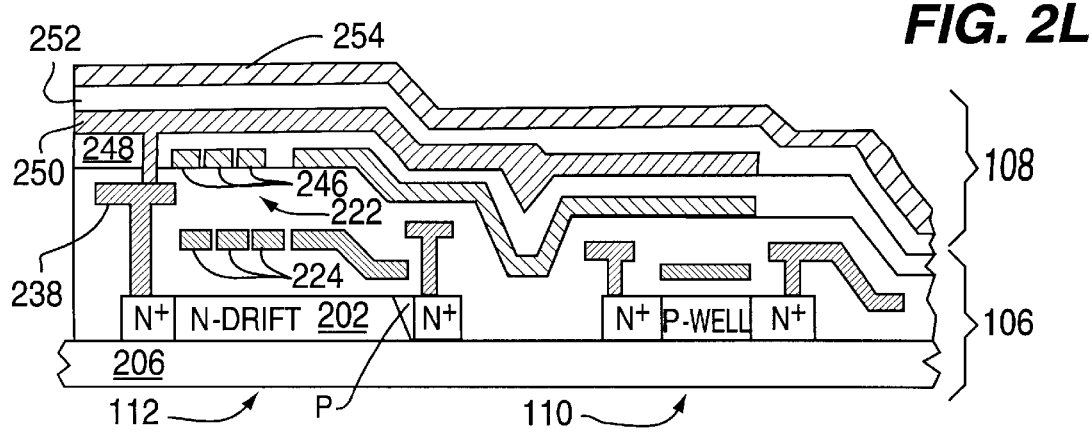

Once the field shield 104 is created, a conventional EL cell 108 is formed over the pixel area. Specifically, as shown in FIG. 2L, a 1 µm thick layer 248 of borophosphosilicate glass (BPSG) is deposited over the entire structure. Thereafter, the BPSG layer and underlying oxide layers are etched to produce an opening to the drain contact pad 240 of transistor 112 and a conductor such as polysilicon (a poly4 layer) or aluminum is deposited and patterned to form one of the EL cell electrodes 250. A layer 252 of ZnS phosphor, or some other appropriate electroluminescent material, in combination with two layers of dielectric material is deposited over the entire structure. This ZnS phosphor and dielectric combination is known in the art as a dielectric-semiconductor-dielectric (DSD) deposition (indicated by reference numeral 252). Lastly, to complete the EL cell 108, a layer 254 of indium tin oxide (ITO) is deposited over the entire structure. The foregoing process utilizes eighteen mask steps to fabricate both transistors and the EL cell in the pixel.

The foregoing description discussed fabricating the inventive pixel in a manner that is conventional in the semiconductor arts, i.e., fabricating the entire device upon one side of a substrate. In an alternative embodiment of the inventive pixel structure shown in FIG. 3, the pixel structure is fabricated on both sides of the substrate 206. In the alternative embodiment of FIG. 3, the N$^+$ regions 228, 230, 232 and 234 are driven completely through the transistor structures by heating the pixel structure to 1150 degrees C. for 4 hours. Thereafter, openings are etched through the silicon substrate 206 and metallic contacts 300 (e.g., aluminum metallization) are deposited on what would normally be the "backside" of the structure. As such, the interconnections of the transistors and the connections to the data and select lines are accomplished on the backside of the structure.

Figure 3:
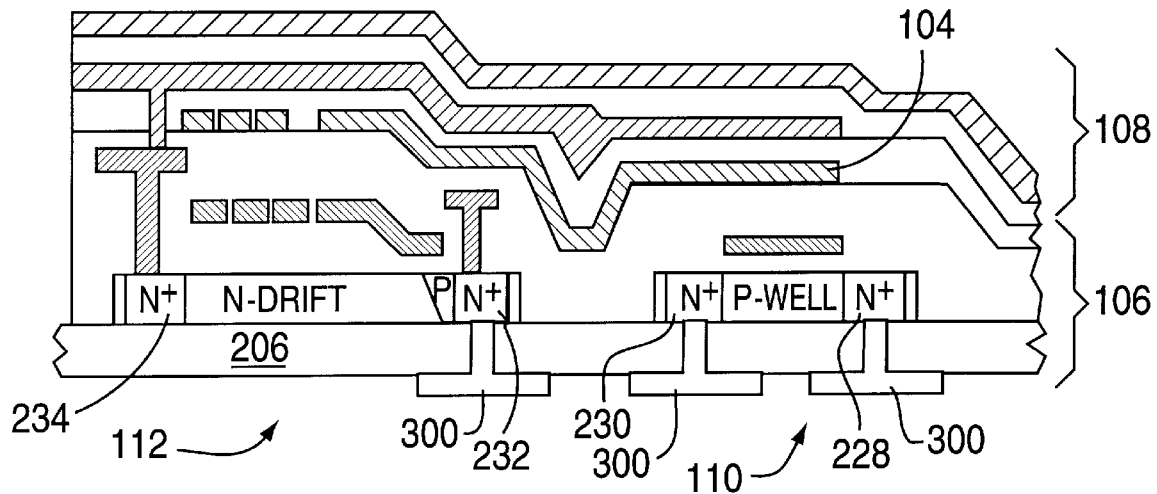
FIG. 3 depicts a cross-sectional illustration of an alternative embodiment of the AMELD pixel of the present invention.

Importantly, in both of the embodiments of the invention shown in FIGS. 2L and 3, the electric field shield 104 lies between the switching circuit 106 and the EL cell 108. The shield is connected to ground such that it isolates the switching circuit, especially the storage node, from the electric field generated during activation of the EL cell. As such, the electric field does not interfere with the operation of the switching circuit. In addition, positioning the shield proximate to the gate of the high voltage transistor forms a well defined storage capacitor (i.e., the gate electrode and the shield form a capacitor) for storing data transferred from the data line through the low voltage transistor.

Figure 4:
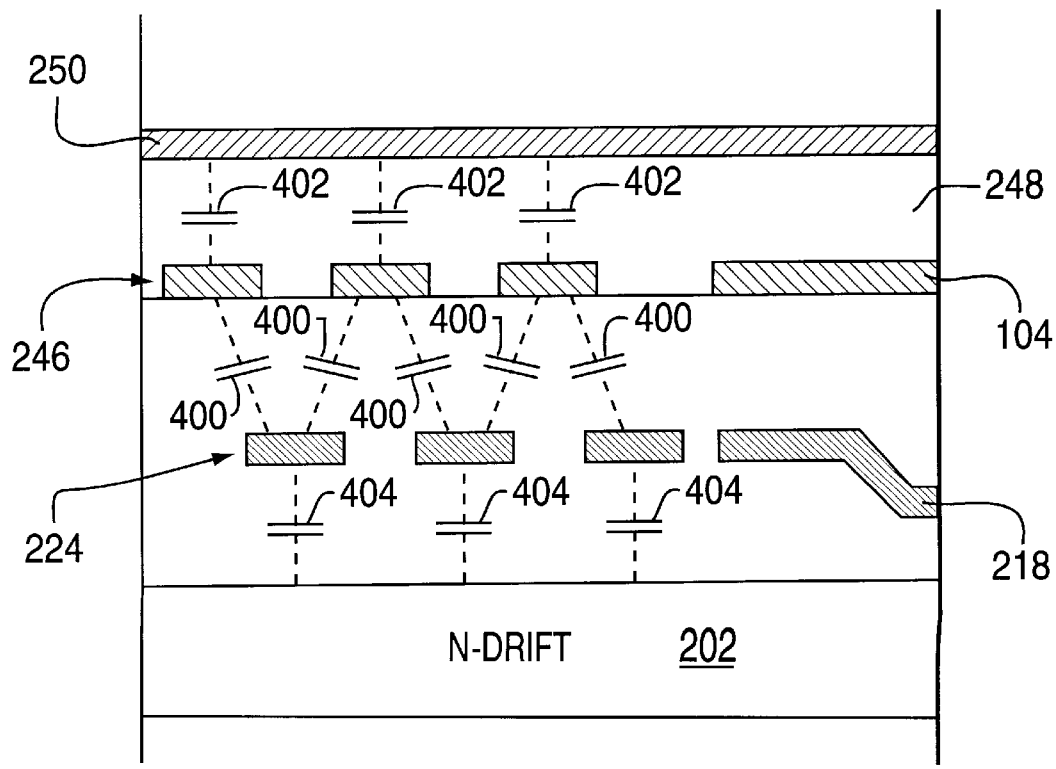
FIG. 4 depicts a cross sectional view of a capacitive divider network within a high voltage transistor.

Another aspect of the present invention is the use of a capacitive divider coupling network 222 to uniformly distribute an electric field in the drift region 202 of the high voltage transistor 112. FIG. 4 depicts a cross sectional view of the capacitive network 222 of the high voltage transistor 112. The capacitive network 222 is formed from portions of the poly1 layer (elements 224), the poly3 layer (elements 246) and the poly4 layer (EL cell electrode 250). These portions of the network lie directly above the drift region 202 in transistor 112. The edges of elements 246 overlap the edges of elements 224 by approximately 2 µm. As such, capacitive coupling exists between the overlapping elements. This coupling is represented by dashed capacitors 400. Additionally, capacitive coupling exists between each of elements 246 and the electrode 250 (indicated by dashed capacitors 402) and capacitive coupling exists between each of elements 224 and the drift region 202 (as indicated by dashed capacitors 404). This capacitive network uniformly distributes an electric field in the drift region. Such uniformity achieves a high breakdown voltage for the transistor. Without such a network, the electric field tends to concentrate at particular points within the drift region due to the direct influence of either the high voltage field or ground and cause breakdown of the transistor at a low voltage. By including this capacitive network, the electric field is more uniformly distributed over the drift region and the breakdown voltage is increased. Such a network is useful in all forms of high-voltage MOS transistors and should not be construed as limited only to high-voltage MOS transistors used in AMELD.

Although various embodiments which incorporate the teachings of the present invention have been shown and described in detail herein, those skilled in the art can readily devise many other varied embodiments that still incorporate these teachings.

We claim:

1. A high-voltage transistor comprising:
   a drain region and a source region being separated by a drift region;
   a gate electrode being parallel to and separated from said drift region by an insulating layer, said gate electrode partially covering said drift region; and
   a capacitive divider network, located proximate to and spaced apart from said drift region; and
   a high voltage electrode, connected to said drain region, extending over said drain region, said source region, said gate electrode, and said capacitive divider network.

2. The transistor of claim 1 wherein said capacitive divider network further comprises:
   a plurality of first conductive elements, spaced apart from said high voltage electrode by a n insulating layer, for accumulating charge from said high voltage electrode;
   a plurality of second conductive elements, spaced apart from said plurality of first conductive elements by an insulating layer, for accumulating charge coupled from said plurality of first conductive elements; and
   said drift region, parallel to and spaced apart from said plurality of second conductive elements by an insulating layer, such that the charge accumulated upon said plurality of second conductive elements produces a substantially uniform electric field within said drift region.

3. The transistor of claim 2 wherein each of said first conductive elements partially overlap at least one of said plurality of second conductive elements in said plurality of second conductive elements.

4. A high-voltage transistor comprising:
   an insulative substrate;
   a drain region and a source region being separated by a drift region located atop said insulative substrate;
   a gate electrode being parallel to and separated from said drift region by an insulating layer, said gate electrode partially covering said drift region; and
   a capacitive divider network, located proximate to and spaced apart from said drift region; and a high voltage electrode, connected to said drain region, extending over said drain region, said source region, said gate electrode, and said capacitive divider network.

5. The transistor of claim 4 wherein said capacitive divider network further comprises:

a high voltage electrode;

a plurality of first conductive elements, spaced apart from said high voltage electrode by an insulating layer, for accumulating charge from said high voltage electrode;

a plurality of second conductive elements, spaced apart from said plurality of first conductive elements by an insulating layer, for accumulating charge coupled from said plurality of first conductive elements; and said drift region, parallel to and spaced apart from said plurality of second conductive elements by an insulating layer, such that the charge accumulated upon said plurality of second conductive elements produces a substantially uniform electric field within said drift region.

6. The transistor of claim 5 wherein each of said first conductive elements partially overlap at least one of said plurality of second conductive elements in said plurality of second conductive elements.

* * * * *